(12) United States Patent
Elmallah et al.

(10) Patent No.: US 12,413,235 B2
(45) Date of Patent: Sep. 9, 2025

(54) DIGITALLY CONTROLLED DELAY LINE GAIN CALIBRATION USING ERROR INJECTION

(71) Applicant: MediaTek Inc., Hsinchu (TW)

(72) Inventors: Ahmed Safwat Mohamed Aboelenein Elmallah, San Jose, CA (US); Amr Tarek Ahmed Abdelrazik Khashaba, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

(*) Notice: Subject to any disclaimer, the term of this patent is extended or adjusted under 35 U.S.C. 154(b) by 162 days.

(21) Appl. No.: 18/492,518

(22) Filed: Oct. 23, 2023

(65) Prior Publication Data

US 2024/0162907 A1 May 16, 2024

Related U.S. Application Data

(60) Provisional application No. 63/383,923, filed on Nov. 16, 2022.

(51) Int. Cl.
 *H03L 7/183* (2006.01)
 *H03L 7/099* (2006.01)
(52) U.S. Cl.
 CPC .............. *H03L 7/183* (2013.01); *H03L 7/099* (2013.01)
(58) Field of Classification Search
 CPC ......... H03L 7/099; H03L 7/0991; H03L 7/08; H03L 7/18; H03L 7/16; H03L 7/00; H03L 7/06; H03L 2207/50
 See application file for complete search history.

(56) References Cited

U.S. PATENT DOCUMENTS

| | | | |
|---|---|---|---|
| 9,438,301 B2 * | 9/2016 | Nagaso | H04L 27/20 |
| 2010/0259305 A1 * | 10/2010 | Lee | H03L 7/24 |
| | | | 327/156 |

OTHER PUBLICATIONS

[No Author Listed], Phase Noise and Jitter in Digital Electronics. Cadence System Analysis. 2021. 6 pages. https://resources.system-analysis.cadence.com/blog/msa2021-phase-noise-and-jitter-in-digital-electronics (Last accessed Jan. 2, 2024).

(Continued)

*Primary Examiner* — Diana J. Cheng
(74) *Attorney, Agent, or Firm* — Winston Hsu

(57) ABSTRACT

The techniques described herein relate to digitally controlled delay line gain calibration using error injection. An example apparatus includes a digitally controlled delay line (DCDL) with a DCDL output and configured to: receive a clock signal to be output from a voltage-controlled oscillator, and delay the clock signal to generate a first delayed clock signal. The apparatus further includes an error injection circuit with a first error injection input and a second error injection input, the first error injection input coupled to the DCDL output. The apparatus additionally includes a phase controller with a phase controller output coupled to the second error injection input, the phase controller configured to, in response to a pseudorandom binary sequence signal, instruct the error injection circuit to generate a second delayed clock signal based on a delay of the first delayed clock signal.

20 Claims, 9 Drawing Sheets

(56) References Cited

OTHER PUBLICATIONS

Elkholy et al., A 3.7 mW low-noise wide-bandwidth 4.5 GHz digital fractional-N PLL using time amplifier-based TDC. IEEE Journal of Solid-State Circuits. Jan. 2, 20159;50(4):867-81.
Sridhar, ITU-T G.8262 Compliance Test Results for the LMK05028 Digital PLL Network Synchronizer. Application Report. Texas Instruments. SNAA315. Apr. 2018. 33 pages.

\* cited by examiner

| Tvco | [ps] | 70 | | | |
|---|---|---|---|---|---|
| Half Tvco | [ps] | 35 | | | |
| | | | | | |
| E0 | [ps] | 37 | | | |
| E1 | [ps] | 40 | | | |
| E0+E1 | [ps] | 77 | | | |
| | | | | | |
| | | | | | |
| Start Phase [ps] | End Phase [ps] | Error | E0 | E1 | E0+E1 |
| 0 | 30 | +ve | RI | RI | RII |
| 30 | 33 | 0 | RI | RII | RII |
| 33 | 63 | -ve | RII | RII | RII |
| 63 | 70 | 0 | RII | RII | RIII |

| Tvco | [ps] | 70 | | | |
|---|---|---|---|---|---|
| Half Tvco | [ps] | 35 | | | |
| | | | | | |
| E0 | [ps] | 37 | | | |
| E1 | [ps] | 29 | | | |
| E0+E1 | [ps] | 66 | | | |
| | | | | | |
| | | | | | |
| Start Phase [ps] | End Phase [ps] | Error | E0 | E1 | E0+E1 |
| 0 | 4 | 0 | RI | RI | RI |
| 4 | 33 | +ve | RI | RI | RII |
| 33 | 41 | 0 | RII | RI | RII |
| 51 | 70 | -ve | RII | RII | RII |

DEAD-ZONE 3
E0+E1<$T_{VCO}$>

DEAD-ZONE 4
Mismatch between E0&E1

DIGITALLY CONTROLLED DELAY LINE GAIN CALIBRATION USING ERROR INJECTION

RELATED APPLICATION

This patent claims priority under 35 U.S.C. § 119(e) to U.S. Provisional Application No. 63/383,923, titled "DIGITALLY CONTROLLED DELAY LINE GAIN CALIBRATION USING ERROR INJECTION," filed on Nov. 16, 2022, which is hereby incorporated by reference herein in its entirety.

FIELD

The techniques described herein relate generally to frequency synthesizers and, more particularly, to digitally controlled delay line gain calibration using error injection.

BACKGROUND

Receivers, such as wireline or wireless signal receivers, are devices that may receive electromagnetic signals. The electromagnetic signals may include high-frequency and low-frequency signal components. Some wireline signal receivers may use frequency synthesizers to generate a waveform at a frequency determined by analog or digital circuits. For instance, a frequency synthesizer may be an electronic device that uses an oscillator to generate a signal with a specific frequency or within a pre-set frequency range. Operation of some such frequency synthesizers may be adversely affected by component and/or system noise.

SUMMARY OF THE DISCLOSURE

Some aspects relate to an apparatus for calibrating a phase-locked loop, comprising a digitally controlled delay line (DCDL) with a DCDL output and configured to: receive a clock signal to be output from a voltage-controlled oscillator; and delay the clock signal to generate a first delayed clock signal; an error injection circuit with a first error injection input and a second error injection input, the first error injection input coupled to the DCDL output; and a phase controller with a phase controller output coupled to the second error injection input, the phase controller configured to, in response to a pseudorandom binary sequence signal, instruct the error injection circuit to generate a second delayed clock signal based on a delay of the first delayed clock signal.

Some aspects relate to another apparatus for calibrating a phase-locked loop, comprising a phase detector with a first phase detector input and a second phase detector input and configured to determine a phase difference between a first clock signal associated with an input path and a second clock signal associated with a feedback path; a first error injection circuit with a first error input and a first error output, the first error input configured to receive an input clock signal, the first error output coupled to the first phase detector input, and the first error injection circuit is configured to delay the input clock signal by a first delay to generate the first clock signal; and a second error injection circuit with a second error input and a second error output, the second error input configured to receive a feedback clock signal, the second error output coupled to the second phase detector input, and the second error injection circuit is configured to delay the feedback clock signal by a second delay to generate the second clock signal.

Some aspects relate to yet another apparatus for calibrating a phase-locked loop, comprising a digitally controlled delay line (DCDL) with a DCDL output and configured to: receive a clock signal, the clock signal to be output from a voltage-controlled oscillator; and delay the clock signal to generate a first delayed clock signal; an error injection circuit with a first error injection input and a second error injection input, the first error injection input coupled to the DCDL output; and a phase controller with a phase controller output coupled to the second error injection input, the phase controller configured to, in response to a pseudorandom binary sequence signal, instruct the error injection circuit to generate a second delayed signal based on a delay of the first delayed clock signal.

Some aspects relate to a method comprising receiving an input clock signal associated with a phase-locked loop; calibrating a first error signal based on half a period of a voltage-controlled oscillator; identifying an error margin associated with the first error signal to generate a first error value and a second error value; injecting a second error signal corresponding to the first error value in the phase-locked loop; injecting a third error signal corresponding to the second error value in the phase-locked loop; and calibrating a delay of the input clock signal based on at least one of the second error signal or the third error signal.

The foregoing summary is not intended to be limiting. Moreover, various aspects of the present disclosure may be implemented alone or in combination with other aspects.

BRIEF DESCRIPTION OF FIGURES

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
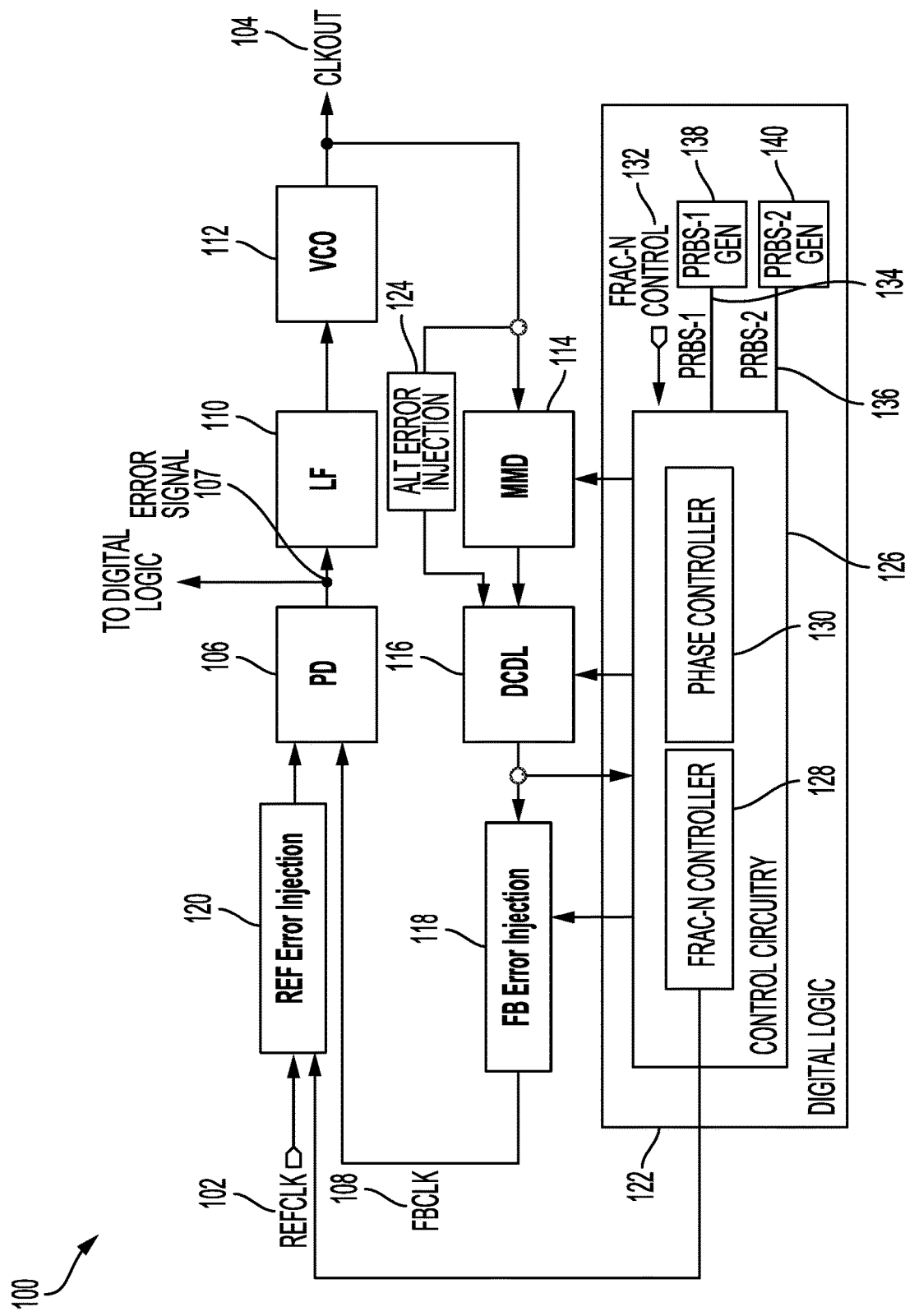
FIG. 1 depicts a schematic illustration of an example phase-locked loop including error injection circuits to calibrate a digitally controlled delay line of the phase-locked loop.

Phase-locked loop (PLL) circuits are used in a wide variety of high frequency applications. Non-limiting examples of high frequency applications include clock clean-up circuits, local oscillators (LOs) for high performance communication links, and ultrafast switching frequency synthesizers. Non-limiting examples of high-performance communication links include wireline communication links, such as Ethernet links, and wireless communication links, such as radiofrequency (RF), radar, and satellite communication links. Some PLL circuits include an oscillator (e.g., a digitally controlled oscillator (DCO), a voltage-controlled oscillator (VCO), a voltage-driven oscillator (VDO)) that adjusts (e.g., constantly adjusts) to match the frequency of an input signal. For example, some such PLL circuits may be used to generate, stabilize, modulate, demodulate, filter, or recover a signal from a communications channel from which the reception of data may be affected by noise associated with the communications channel.

Some PLL circuits may output signals, such as clock signals, which are affected by phase drift over time. Some such PLL circuits use a phase rotator (e.g., phase rotator circuit) to receive a clock phase from the PLL and shift (e.g., modulo shift) the clock phase into a desired phase angle to overcome the phase drift. However, phase rotators can consume a substantial amount of power and area. Additionally, phase rotators can have high non-linearity and limited resolution. In some instances, it can be challenging to calibrate the frequency of the phase rotators.

Some PLL circuits utilize a digitally controlled delay line (DCDL) to overcome the shortcomings of phase rotators. For example, a DCDL (e.g., a DCDL circuit) can consume substantially less power and area than a phase rotator. In some instances, a DCDL has improved linearity and resolution when compared to a phase rotator.

One challenge of using a DCDL to change a phase of a signal output from a PLL is that the DCDL can be a source of phase noise and spurs (e.g., fractional spurs). Such phase noise and spurs can degrade signal quality and overall operation of the PLL, such as by introducing jitter (e.g., deterministic jitter) into the PLL. Another challenge of using a DCDL is that, although more linear than a phase rotator, the DCDL may have non-linear characteristics. Yet another challenge of using a DCDL is gain error. For example, the gain error of a DCDL can be representative of how well and/or closely the slope of an actual transfer function of the DCDL matches and/or overlaps the slope of the ideal transfer function for the DCDL.

There are challenges with calibrating DCDL gain error. One such challenge is that when a PLL circuit generates a pulse position modulation (PPM) signal, the PPM signal can be substantially attenuated and thereby result in an inaccurate DCDL gain. Another such challenge is when a PLL includes a fractional-N (Frac-N) circuit, the Frac-N circuit may use the same error template as a dual clock compare (DCC) circuit of the PLL and thusly the DCC and DCDL rang errors may be indistinguishable. Yet another such challenge is that coupling of the supply and substrate may cause the error from the DCDL range and the coupling may be indistinguishable.

The inventors have recognized that the aforementioned challenges of using phase rotators in PLL circuits have not been overcome by using DCDLs. To overcome the deficiencies of phase rotators and/or DCDLs in PLL circuits, the inventors have developed technology for digitally controlled delay line calibration using error injection.

Exemplary PLL circuits disclosed herein overcome the aforementioned challenges by including error injection circuits that can intentionally introduce delay signals to shift a signal, such as a clock signal, into a different error detection region. In some disclosed embodiments, a PLL circuit can include a DCDL and at least a first error injection circuit. The DCDL can be configured to delay an output signal, such as an output clock signal from an oscillator (e.g., a voltage-controlled oscillator), by a first delay (e.g., a first delay time, a first delay period, a first delay time period) to generate a delayed output signal. The first error injection circuit can be configured to delay the delayed output signal by a second delay (e.g., a second delay time, a second delay period, a second delay time period) to generate a delayed feedback signal. The example PLL circuit can include a phase detector configured to compare a phase difference between an input signal, such as an input clock signal, and the delayed feedback signal. Beneficially, the second delayed signal can be generated such that the phase difference is reduced.

In some embodiments, the PLL circuit can include a second error injection circuit that can be configured to delay the input signal by a third delay (e.g., a third delay time, a third delay period, a third delay time period) to generate a delayed input signal. The phase detector can be configured to compare a phase difference between the delayed input signal and the delayed feedback signal. Beneficially, the input delayed signal can be generated such that the phase difference is reduced.

In some embodiments, the PLL circuit can include digital logic, which can implement a phase controller, to control at least one of the first error injection circuit or the second error injection circuit. For example, the digital logic can instruct the first error injection circuit to delay the output signal in response to a first pseudorandom binary sequence signal. In some embodiments, the digital logic can instruct the first error injection circuit to pass the output signal without delay in response to a second pseudorandom binary sequence signal.

In some embodiments, the digital logic can instruct the second error injection circuit to delay the input signal in response to a third pseudorandom binary sequence signal. In some embodiments, the digital logic can instruct the second error injection circuit to pass the input signal without delay in response to a fourth pseudorandom binary sequence signal.

Beneficially, at least one of the first error injection circuit or the second error injection circuit can delay respective signals such that a gain error of the DCDL can be reduced. Beneficially, by reducing the DCDL gain error, the phase difference detected by the phase detector can also be reduced, which can improve overall operation of the PLL, improve stability of the output signals generated by the PLL, and reduce sensitivity to noise sources such as phase noise and spurs.

Turning to the figures, the illustrated example of FIG. 1 depicts an example phase-locked loop (PLL) 100. The PLL 100 is a circuit (e.g., a PLL circuit) that generates an output clock signal 104 (identified by CLKOUT) whose phase is related to a phase of a reference clock signal 102 (identified by REFCLK). For example, the PLL 100 can synchronize and/or lock a phase of the output clock signal 104 with a phase of the reference clock signal 102. In some embodiments, the PLL 100, or portion(s) thereof, can implement a frequency synthesizer that produces a range of frequencies from a single fixed oscillator.

In the illustrated example, the reference clock signal 102 is an input signal (e.g., an input clock signal) that can be transmitted by a transmitter and/or received by a receiver. For example, the PLL 100 can be configured to receive the reference clock signal 102 from a wireline receiver, such as a data communication wireline receiver. Non-limiting examples of wireline receivers include Ethernet interfaces, Peripheral Component Interconnect (PCI) interfaces, Serial Digital Interfaces (SDI), Universal Serial Bus (USB) interfaces, and High-Definition Multimedia Interfaces (HDMI). Alternatively, the PLL 100 can be configured to receive the reference clock signal 102 from a wireless receiver. Non-limiting examples of wireless receivers include Wireless Fidelity (Wi-Fi) receivers, Bluetooth receivers, near-field communication (NFC) receivers, radio-frequency identification (RFID) receivers, and satellite receivers (e.g., beyond-line-of-site (BLOS) satellite receivers, line-of-site (LOS) satellite receivers, etc.).

In some embodiments, the PLL 100 is included in and/or associated with an electronic device. Non-limiting examples of electronic devices include gateways, routers, switches, laptop computers, tablet computers, cellular phones (e.g., smartphones), televisions (e.g., smart televisions), set-top boxes, streaming devices, and wearable devices (e.g., headphones, headsets, smartwatches, smart glasses, etc.). For example, the output clock signal 104 can be provided to additional circuitry, such as a transmitter, a receiver, and/or a programmable processor. Non-limiting examples of programmable processors include central processing units (CPUs), digital signal processors (DSPs), graphics processing units (GPUs), and field programmable gate arrays (FPGAs).

In some embodiments, the reference clock signal 102 is a clock signal whose frequency has been doubled and/or otherwise increased by a frequency doubler (not shown but may be included in the PLL 100). For example, the reference clock signal 102 can be a doubled reference clock signal. In some embodiments, the frequency doubler is a frequency doubler circuit that can increase the frequency of the reference clock signal 102 to increase a bandwidth of the PLL 100. In some embodiments, the frequency doubler can be implemented by an oscillator (e.g., a reference oscillator, an oscillator circuit) to increase the frequency of the reference clock signal 102. In some embodiments, the frequency doubler can be configured to receive the reference clock signal 102 from a receiver (e.g., a wireline receiver, a wireless receiver). Alternatively, the PLL 100 may utilize a different frequency increaser than the frequency doubler to triple, quadruple, etc., the reference clock signal 102.

The PLL 100 of the illustrated example includes a phase detector 106 (identified by PD and may also be referred to as a phase comparator or mixer) to compare a first phase of the reference clock signal 102, or delayed version(s) thereof, and a second phase of a feedback clock signal 108 (identified by FBCLK). The feedback clock signal 108 can be a delayed instance of the output clock signal 104. In some embodiments, the PD 106 can be a phase detector circuit that can generate and/or output a voltage according to a phase difference of the first and second phases. In some embodiments, the voltage can be an error signal 107 that is representative of an error that is detected between the phases of the reference clock signal 102 and the feedback clock signal 108. The PD 106 of the illustrated example has a first input (e.g., a first detector input, a first phase detector input) configured to receive the reference clock signal 102. For example, the first input can be coupled to an output (e.g., a doubler output, a frequency doubler output) of a frequency doubler. For example, the PD 106 and the frequency doubler can be coupled together through one or more electrical connections. Non-limiting examples of electrical connections include opto-isolators, pads, traces, wires, and vias.

The PLL 100 of this example includes a loop filter 110 (identified by LF). In some embodiments, the LF 110 is a loop filter circuit that converts the output of the PD 106 into a control signal (e.g., a control voltage) for a voltage-controlled oscillator 112 (identified by VCO) of the PLL 100. For example, the PD 106 can be implemented by one or more charge pumps that can output a current representative of the detected error. In some such embodiments, the LF 110 can convert the current from the one or more charge pumps to the control voltage for the VCO 112. Alternatively, the PD 106 may output a voltage representative of the detected error. For example, the PD 106 can be implemented by one or more analog circuits configured to output a voltage representative of the detected error. In some embodiments, the LF 110 can filter out and/or attenuate noise coming from the reference clock signal 102 to the control voltage. The LF 110 of the illustrated example has an input (e.g., a filter input, a loop filter input) coupled to an output (e.g., a detector output, a phase detector output) of the PD 106.

The PLL 100 of this example includes the VCO 112 to generate and/or output the output clock signal 104 according to the control voltage output from the LF 110. In some embodiments, the VCO 112 is a VCO circuit that generates and/or outputs the output clock signal 104. For example, the VCO 112 can be implemented by one or more analog circuits configured to generate and/or output the output clock signal 104. In some embodiments, the output clock signal 104 is a signal (e.g., a sinusoidal signal) whose frequency closely matches (e.g., matches within 1%, 5%, etc.) of the center frequency provided by the LF 110. The VCO 112 of this example has an input (e.g., an oscillator input, a VCO input) coupled to an output (e.g., a filter output, a loop filter output) of the LF 110.

In the illustrated example, the PLL 100 includes a multi-modulus divider 114 (identified by MMD) to divide and/or reduce a frequency of the output clock signal 104. Additionally or alternatively, a pre-division ratio may be included in the PLL 100 prior to the MMD 114. In some embodiments, the MMD 114 can be an MMD circuit that divides a frequency of the output clock signal 104 by a divisor (e.g., 2, 3, 4, etc.) to generate a divided clock signal. For example, the MMD 114 can be implemented using one or more analog and/or digital circuits configured to divide the frequency of the output clock signal 104. In some embodiments, the MMD 114 can delay the divided clock signal by a time delay (e.g., a time duration, a time period) in a time delay range to generate a delayed clock signal. For example, time delays in the time delay range can range from zero time delay to a time delay up to at least a period of the VCO 112 (e.g., $T_{VCO}$). Any other time delay range may be utilized. The MMD 114 of this example has an input (e.g., a divider input, an MMD input) coupled to an output (e.g., an oscillator output) of the VCO 112.

The PLL 100 of the illustrated example includes a digitally controlled delay line (DCDL) 116 to delay the output, such as a divided clock signal, from the MMD 114, by a time delay in a time delay range to generate the feedback clock signal 108. In some embodiments, the DCDL 116 can cause a reduction of a difference (e.g., a difference in phases) of the reference clock signal 102 and the feedback clock signal 108. For example, the difference can be representative of an error generated by supply and substrate coupling, DCDL gain error, DCDL non-linearity, etc., and/or any combination(s) thereof. In some embodiments, the DCDL 116 is implemented by one or more analog and/or digital circuits. For example, the DCDL 116 can be implemented by one or more buffers (e.g., circular buffers) that implement one or more discrete digital logic elements. Alternatively, the DCDL 116 may be implemented by any other analog and/or digital components or elements.

In some embodiments, the error can be reduced and/or mitigated by calibrating one or more components of the PLL 100, such as the DCDL 116, using at least a first error injection circuit 118 (identified by FB ERROR INJECTION) and a second error injection circuit 120 (identified by REF ERROR INJECTION), each of which can be controlled at least in part by digital logic 122. The first error injection circuit 118 of this example has an input (e.g., an error injection input) coupled to an output (e.g., a delay line output, a DCDL output) of the DCDL 116. The first error injection circuit 118 has an output (e.g., an error injection output) coupled to an input of the PD 106.

The second error injection circuit 120 of this example has an input (e.g., an error injection input) configured to receive the reference clock signal 102. The second error injection circuit 120 has an output (e.g., an error injection output) coupled to an input of the PD 106. Alternatively, the first error injection circuit 118 and/or the second error injection circuit 120 may be disposed elsewhere in the PLL 100. For example, the first error injection circuit 118 and/or the second error injection circuit 120 may be coupled between an input of the MMD 114 and an input of the DCDL 116 (identified by ALT ERROR INJECTION 124). In some embodiments, the first error injection circuit 118 and/or the second error injection circuit 120, or portion(s) thereof, can be in circuit elsewhere along a reference path of the PLL 100, which can be a path that includes at least one of the PD 106, the LF 110, or the VCO 112. In some embodiments, the first error injection circuit 118 and/or the second error injection circuit 120, or portion(s) thereof, can be in circuit elsewhere along a feedback path of the PLL 100, which can be a path that includes at least one of the VCO 112, the MMD 114, the DCDL 116, or the PD 106.

In some embodiments, the MMD 114, the DCDL 116, the first error injection circuit 118, and/or, more generally, the PLL 100, can be configured to cause generation of the feedback clock signal 108 to reduce the error detected by the PD 106. For example, the digital logic 122 includes control circuitry 126, which can be implemented by one or more control circuits, to configure at least one of the MMD 114 or the DCDL 116 to reduce a difference between the reference clock signal 102 and the feedback clock signal 108. In some embodiments, the reduction of the difference can be implemented by shifting the feedback clock signal 108 to have the same error as the reference clock signal 102.

In the illustrated example, the control circuitry 126 includes a fractional-N (Frac-N) controller 128 to implement Frac-N control logic. For example, the Frac-N controller 128 can change (e.g., periodically change) the division ratio of the MMD 114 from N to N+1 and back such that the average is N+F/M where 0≤F<M and N, F, and M are integers. The control circuitry 126 of this example includes a phase controller 130 to implement digitally controlled delay (DCD) calibration control logic.

The control circuitry 126 of this example can receive first control signal(s) 132 (identified by Frac-N Control), such as digital code(s) (e.g., digital code word(s)), to set an initial configuration of the control circuitry 126, or portion(s) thereof (e.g., the Frac-N controller 128)). The control circuitry 126 of this example can receive second control signals 134, 136. The second control signals 134, 136 are pseudorandom binary sequence (PRBS) signals respectively generated by PRBS generators 138, 140. For example, a first PRBS generator 138 (identified by PRBS-1 GEN) can generate and/or output first PRBS signals 134 (identified by PRBS-1) and a second PRBS generator 140 (identified by PRBS-2 GEN) can generate and/or output second PRBS signals 136 (identified by PRBS-2).

In some embodiments, the PRBS generators 138, 140 can be implemented by one or more analog circuits and/or one or more digital circuits configured to generate signals based on pseudorandom binary sequences (also referred to as pseudorandom binary codes or pseudorandom bitstreams). Pseudorandom binary sequences are binary sequences that are generated by a deterministic algorithm but are difficult to predict and can exhibit statistical behavior similar to a truly random sequence.

In some embodiments, the digital logic 122 is configured to receive the error signal 107 from the PD 106. For example, the digital logic 122 can determine whether the error signal 107 is greater than or less than a voltage threshold (e.g., 0 volts (V), 0.5 V, etc.) for each clock cycle of the PD 106. In some embodiments, the digital logic 122 can generate a first digital code based on the error signal 107 and output the first digital code to the MMD 114 to change a configuration of the MMD 114. The configuration of the MMD 114 can cause a change in a time delay that the MMD 114 applies to the output clock signal 104. In some embodiments, the digital logic 122 can generate a second digital code based on the error signal 107 and output the second digital code to the DCDL 116 to change a configuration of the DCDL 116. The configuration of the DCDL 116 can cause a change in a time delay that the DCDL 116 applies to the delayed clock signal from the MMD 114.

In the illustrated example, the control circuitry 126, and/or, more generally, the digital logic 122, has a first input (e.g., a first control input, a first digital logic input) coupled to an output of the PD 106 and configured to receive the error signal 107. In this example, the control circuitry 126, and/or, more generally, the digital logic 122, has a second input (e.g., a second control input, a second digital logic input) coupled to an output of the DCDL 116 and configured to receive the delayed clock signal from the DCDL 116.

In the illustrated example, a first output (e.g., a first control output) of the control circuitry 126, and/or, more generally, the digital logic 122, is coupled to an input of the MMD 114. In this example, a second output (e.g., a second control output) of the control circuitry 126, and/or, more generally, the digital logic 122, is coupled to an input of the DCDL 116. In this example, a third output (e.g., a third control output) of the control circuitry 126, and/or, more generally, the digital logic 122, is coupled to an input of the first error injection circuit 118. In this example, a fourth output (e.g., a fourth control output) of the control circuitry 126, and/or, more generally, the digital logic 122, is coupled to an input of the second error injection circuit 120.

In example operation, the MMD 114 can receive the output clock signal 104. The MMD 114 can divide the output clock signal by a divisor to generate a divided clock signal. The MMD 114 can delay the divided clock signal by a first time delay to generate a first delayed clock signal. Alternatively, the MMD 114 can pass the output clock signal 104 or the divided clock signal without delay to the DCDL 116.

In example operation, the DCDL 116 can receive a clock signal. For example, the DCDL 116 can receive the output clock signal 104 to be output from the VCO 112 through the MMD 114. For example, the MMD 114 can pass the output clock signal 104 without delay from the VCO 112 to the DCDL 116. In some embodiments, the DCDL 116 can receive the first delayed signal from the MMD 114. The DCDL 116 can delay the clock signal (e.g., the output clock signal 104, the first delayed clock signal) by a second time delay to generate a second delayed clock signal.

In example operation, the phase controller 130 can instruct, in response to a first one of the second PRBS signals 136, the first error injection circuit 118 to delay the second delayed clock signal by a third time delay. Alternatively, the phase controller 130 can instruct, in response to a second one of the second PRBS signals 136, the first error injection circuit 118 to pass the second delayed clock signal without delay to the PD 106.

In example operation, the phase controller 130 can instruct, in response to a first one of the first PRBS signals 134, the second error injection circuit 120 to delay the reference clock signal 102 by a fourth time delay. Alternatively, the phase controller 130 can instruct, in response to a second one of the first PRBS signals 134, the second error injection circuit 120 to pass the reference clock signal 102 without delay to the PD 106.

Beneficially, the phase controller 130 can determine to direct at least one of the first error injection circuit 118 or the second error injection circuit 120 to delay a received clock signal such that a phase difference detected by the PD 106 is reduced. Beneficially, in response to at least one of the first error injection circuit 118 or the second error injection circuit 120 introducing and/or injecting an error signal into the PLL 100, the phase controller 130, and/or, more generally, the control circuitry 126, and/or, more generally, the digital logic 122, can calibrate the DCDL 116 to reduce DCDL gain error. For example, by introducing and/or injecting known errors (e.g., errors from the first and/or second error injection circuits 118, 120), the digital logic 122 can cause calibration of the DCDL 116 to reduce DCDL gain error.

While an example implementation of the PLL 100 is depicted in FIG. 1, other implementations are contemplated. For example, one or more blocks, components, functions, etc., of the PLL 100 may be combined or divided in any other way. The PLL 100 of the illustrated example may be implemented by hardware alone, or by a combination of hardware, software, and/or firmware. For example, the PLL 100 may be implemented by one or more analog circuits (e.g., capacitors, comparators, diodes, inductors, operational amplifiers, resistors, transistors, etc.), one or more digital circuits (e.g., logic gates, etc.), one or more hardware-implemented state machines, one or more programmable processors, one or more application specific integrated circuits (ASICs), etc., and/or any combination(s) thereof. The PLL 100 of the illustrated example can be implemented by one or more integrated circuits (ICs) on the same die or two or more different dies.

Figure 2:
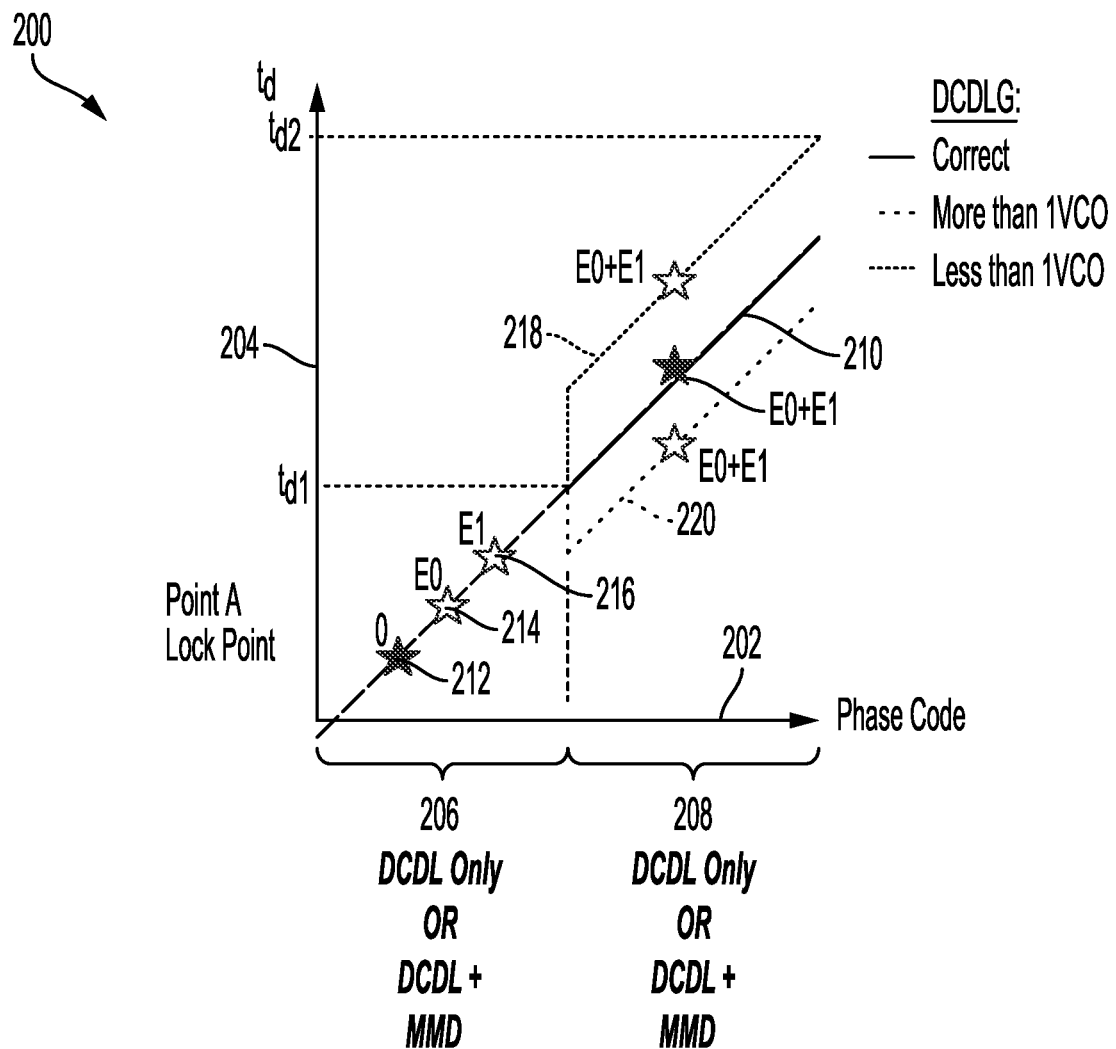
FIG. 2 is a plot depicting example operation of the error injection circuits of FIG. 1.

FIG. 2 is a plot 200 depicting example operation of the error injection circuits 118, 120 of FIG. 1. The plot 200 has an x-axis 202 representing a range of phase codes, which can be digital codes that correspond to a desired and/or expected phase of a PLL, such as the PLL 100 of FIG. 1. The plot 200 has a y-axis 204 representing a range of time delays (identified by $t_d$). The plot 200 of the illustrated example can represent a gain of a DCDL, such as the DCDL 116 of FIG. 1. For example, the plot 200 can represent a time delay that may be needed to achieve a desired and/or expected phase of the PLL 100 in accordance with an ideal transfer function for the DCDL.

In the illustrated example, the range of phase codes can include a first range 206 and a second range 208. The first range 206 can correspond to time delays that can be achieved using the DCDL 116 alone, or by using at least one of the MMD 114 or the DCDL 116 (e.g., a combination of the MMD 114 and/or the DCDL 116). For example, the DCDL 116 can be used to delay a signal, such as a clock signal, up to at least a first time delay identified by $t_{d1}$. In some embodiments, the first time delay can correspond to a period of the VCO 112 of FIG. 1 ($T_{VCO}$). The second range 208 can correspond to time delays that can be achieved using a combination of the MMD 114 and the DCDL 116. For example, the second range 208 can begin at the beginning of the first range 206 or at the end of the first range 206.

In some embodiments, a combination of the MMD 114 and the DCDL 116 can be used to delay a signal, such as a clock signal, up to at least a second time delay identified by $t_{d2}$, which is greater than $t_{d1}$. In some embodiments, the second time delay can correspond to twice of a period of the VCO 112 of FIG. 1 ($2*T_{VCO}$). Beneficially, in some embodiments, by using the MMD 114 and the DCDL 116, the time delay range can be extended from $t_{d1}$ to $t_{d2}$.

The example plot 200 depicts an ideal transfer function 210. The ideal transfer function 210 is characterized and/or defined by a gain of 1. Alternatively, the ideal transfer function 210 may be characterized and/or defined by any other gain. In this example, the plot 200 depicts various lock points of the PLL 100. For example, a first lock point 212 (identified by Point A Lock Point) is depicted and can correspond to a time delay to be applied to the reference clock signal 102 of FIG. 1 such that the PLL 100 can lock without additional delay. A second lock point 214 is depicted and can correspond to a time delay injected into the PLL 100 by an error injection circuit, such as the first error injection circuit 118 of FIG. 1. For example, the first error injection circuit 118 can inject a time delay corresponding to E0 of the plot 200. In some embodiments, E0 can be a first error representing a first time delay that can be implemented by the first error injection circuit 118. A third lock point 216 is depicted and can correspond to a time delay injected into the PLL 100 by another error injection circuit, such as the second error injection circuit 120 of FIG. 1. For example, the second error injection circuit 120 can inject a time delay corresponding to E1 of the plot 200. In some embodiments, E1 can be a second error representing a second time delay that can be implemented by the second error injection circuit 120.

In the illustrated example, the plot 200 depicts deviations from the ideal transfer function 210 as the phase codes and corresponding time delays increase. For example, the plot 200 depicts a first deviation 218 and a second deviation 220 from the ideal transfer function 210. For example, the first deviation 218 can correspond to a first gain of the DCDL 116 being less than $T_{VCO}$ of the VCO 112. In some such embodiments, the first gain can represent that too little or not enough time delay has been injected into the PLL 100. In the illustrated example, the second deviation 220 can correspond to a second gain of the DCDL 116 being greater than $T_{VCO}$ of the VCO 112. In some such embodiments, the second gain can represent that too much time delay has been injected into the PLL 100.

In the example plot 200, a combination (e.g., a sum) of E0 and E1 (identified by E0+E1) can exercise the error of the PLL 100 from a first error region, which may be defined by the first range 206, to a second error region, which may be defined by the second range 208 (e.g., a portion of the second range 208 that extends beyond the first range 206). In some embodiments, the errors (e.g., E0, E1, E0+E1) can be cycled through in any order by way of an independent template (e.g., a PRBS schema). For example, the phase controller 130 can determine, in response to one(s) of the first PRBS signals 134 and/or the second PRBS signals 136 of FIG. 1, can cause injection of a first delay (e.g., E0), a second delay (e.g., E1), and/or a third delay (e.g., E0+E1) into the PLL 100. Beneficially, by scrambling the phase codes through such a PRBS schema, the error can be exercised between the error regions. For example, by injecting delay based on randomly generating PRBS signals, the average injected delay over time may be discernable as illustrated by the first and second deviations 218, 220. In some embodiments, the phase controller 130, and/or, more generally, the digital logic 122 can detect the deviations 218, 220 from the ideal transfer function 210 and, thusly, determine a subsequent injection of error to compensate and/or mitigate the detected error of the PLL 100.

Figure 3:
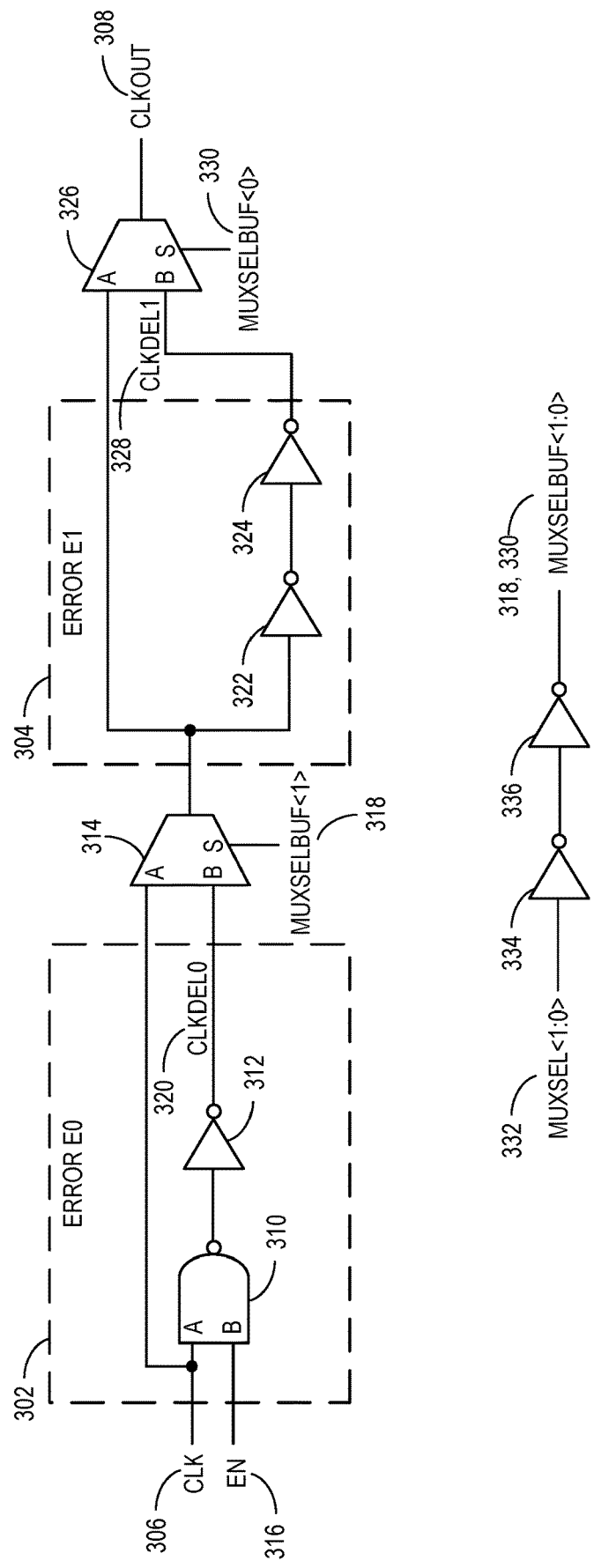
FIG. 3 depicts an example implementation of a first error injection circuit and a second error injection circuit.

FIG. 3 depicts an example implementation of a first error injection circuit 302 and a second error injection circuit 304. In some embodiments, FIG. 3 can represent controlled error addition such that an input clock signal 306 (identified by CLK) can be delayed and output as an output clock signal 308 (identified by CLKOUT) based on a combination of the first error injection circuit 302 and the second error injection circuit 304.

In some embodiments, the first error injection circuit 302 can implement the first error injection circuit 118 of FIG. 1. For example, the first error injection circuit 302 can delay a signal by E0 of FIG. 2. In some embodiments, the second error injection circuit 304 can implement the second error injection circuit 120 of FIG. 2. For example, the second error injection circuit 304 can delay a signal by E1 of FIG. 2. In some embodiments, the combination of the first error injection circuit 302 and the second error injection circuit 304 can delay a signal by E0+E1 of FIG. 2.

The first error injection circuit 302 includes a first logic gate 310 and a second logic gate 312. The first logic gate 310 of this example is a NAND logic gate and the second logic gate is an inverter logic gate. Alternatively, the first error injection circuit 302 may be implemented using any other combination of logic gates than those depicted in the example of FIG. 3. In FIG. 3, the input clock signal 306 is provided to a first input (e.g., a first multiplexer input) (identified by A) of a first multiplexer 314. An output of the first logic gate 310 is coupled to an input of the second logic gate 312. For example, the first logic gate 310 can be coupled to the second logic gate 312 via one or more electrical connections as described herein. An output of the second logic gate 312 is coupled to a second input (e.g., a second multiplexer input) (identified by B) of the multiplexer 314.

The first logic gate 310 is configured to receive the input clock signal 306 and an enable signal 316 (identified by EN). In some embodiments, the input clock signal 306 can correspond to the output signal from the DCDL 116 of FIG. 1. The first logic gate 310 can output a logic low signal (e.g., a signal representative of a digital zero, a logic zero) to the second logic gate 312 in response to the clock signal 306 and the enable signal 316 being logic high signals. The second logic gate 312 can invert the logic low signal to a logic high signal (e.g., a signal representative of a digital one, a logic one) and output the logic high signal to the first multiplexer 314.

In some embodiments, the first error injection circuit 302 can pass, provide, and/or output the input clock signal 306 without delay to the first multiplexer 314. For example, the phase controller 130, and/or, more generally, the digital logic 122 of FIG. 1, can generate a first selection signal 318 (identified by MUXSELBUF<1>) to select the first input such as to output the input clock signal 306 to the second error injection circuit 304 without delay. In some embodiments, the first selection signal 318 can be generated in response to one of the first PRBS signals 134.

In some embodiments, the first error injection circuit 302 can delay the input clock signal 306 to generate a first delayed clock signal 320 (identified by CLKDEL0). For example, the phase controller 130, and/or, more generally, the digital logic 122 of FIG. 1, can generate the first selection signal 318 to select the second input such as to output the first delayed clock signal 320 to the second error injection circuit 304. In some embodiments, the first selection signal 318 can be generated in response to another one of the first PRBS signals 134.

The second error injection circuit 304 includes a third logic gate 322 and a fourth logic gate 324. The third logic gate 322 and the fourth logic gate 324 of this example are inverter logic gates. Alternatively, the second error injection circuit 304 may be implemented using any other combination of logic gates than those depicted in the example of FIG. 3. In FIG. 3, the output signal from the first multiplexer 314 is provided to a first input (e.g., a first multiplexer input) (identified by A) of a second multiplexer 326. An output of the third logic gate 322 is coupled to an input of the fourth logic gate 324. For example, the third logic gate 322 can be coupled to the fourth logic gate 324 via one or more electrical connections as described herein. An output of the fourth logic gate 324 is coupled to a second input (e.g., a second multiplexer input) (identified by B) of the second multiplexer 326.

The third logic gate 322 is configured to receive the output signal from the first multiplexer 314. For example, the third logic gate 322 can receive a logic high signal, invert the logic high signal to a logic low signal, and output the logic low signal to the fourth logic gate 324. The fourth logic gate 324 can invert the logic low signal to a logic high signal and output the logic high signal to the second multiplexer 326 as a second delayed clock signal 328 (identified by CLKDEL1). For example, the path along the third and fourth logic gates 322, 324 can delay the output signal from the first multiplexer 314 by a time delay that may correspond to E1 of FIG. 2.

In some embodiments, the second error injection circuit 304 can pass, provide, and/or output the output signal from the first multiplexer 314 without delay to the second multiplexer 326. For example, the phase controller 130, and/or, more generally, the digital logic 122 of FIG. 1, can generate a second selection signal 330 (identified by MUXSELBUF<0>) to select the first input such as to output the output signal as the output clock signal 308 without delay. In some embodiments, the second selection signal 330 can be generated in response to one of the second PRBS signals 136. In some embodiments, the output clock signal 308 can correspond to the delayed clock signal output from the second error injection circuit 120 of FIG. 1.

In some embodiments, the second error injection circuit 304 can delay the output of the first multiplexer 314, which can be the input clock signal 306 or the first delayed clock signal 320, to generate the second delayed clock signal 328. For example, the phase controller 130, and/or, more generally, the digital logic 122 of FIG. 1, can generate the second selection signal 330 to select the second input such as to output the second delayed clock signal 328 as the output clock signal 308. In some embodiments, the second selection signal 330 can be generated in response to another one of the second PRBS signals 136.

In some embodiments, the selection signals 318, 330 can be buffered. For example, multiplexer selection signal(s) 332 can be provided to a fifth logic gate 334, which is coupled to a sixth logic gate 336, both of which are inverter logic gates. The sixth logic gate 336 can output the selection signals 318, 330. Alternatively, the multiplexer selection signal(s) 332 can be buffered using any other combination of logic gates.

Figure 4:
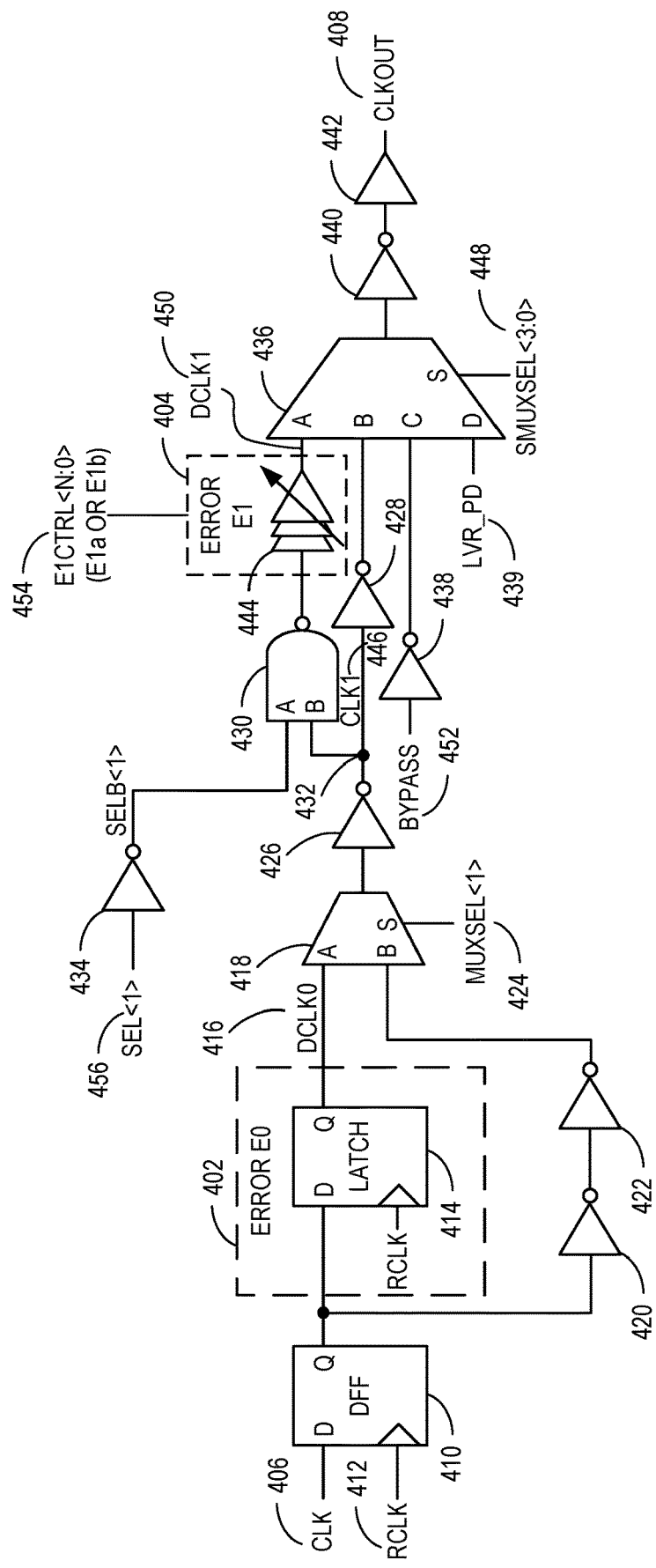
FIG. 4 depicts another example implementation of a first error injection circuit and a second error injection circuit.

FIG. 4 depicts another example implementation of a first error injection circuit 402 (identified by ERROR E0) and a second error injection circuit 404 (identified by ERROR E1). In some embodiments, FIG. 4 can represent controlled error addition such that an input clock signal 406 (identified by CLK) can be delayed and output as an output clock signal 408 (identified by CLKOUT) based on a combination of the first error injection circuit 402 and the second error injection circuit 404. In some embodiments, the second error injection circuit 404 can change a time delay at which it can delay a signal and/or otherwise is adjustable.

In some embodiments, the first error injection circuit 402 can implement the first error injection circuit 118 of FIG. 1. For example, the first error injection circuit 402 can delay a signal by E0 of FIG. 2. In some embodiments, the second error injection circuit 404 can implement the second error injection circuit 120 of FIG. 2. For example, the second error injection circuit 404 can delay a signal by E1 of FIG. 2 or, in some embodiments, E1a or E1b as described below. In some embodiments, the combination of the first error injection circuit 402 and the second error injection circuit 404 can delay a signal by E0+E1 of FIG. 2 or, in some embodiments, E0+E1a or E0+E1b as described below.

In the illustrated example, a D-flip-flop 410 (identified by DFF) is configured to receive the input clock signal 406 at an input (identified by D) The D-flip-flop 410 can be triggered in response to a clock edge (e.g., a rising edge, a falling edge) of a reference clock signal 412 (identified by RCLK). The D-flip-flop 410 can be configured to output the input clock signal 406 to the first error injection circuit 402. Alternatively, the D-flip-flop 410 may be any other type of flip-flop.

The first error injection circuit 402 of this example is implemented by a latch 414. Alternatively, the first error injection circuit 402 may be implemented by the D-flip-flop 410 and the latch 414. The latch 414 can be configured to delay the input clock signal 406 by a time delay to generate a first delayed clock signal 416 (identified by DCLK0). The latch 414 can be triggered in response to an edge (e.g., a rising edge, a falling edge) of the reference clock signal 412. The output of the latch 414 is coupled to a first input (identified by A) of a first multiplexer 418.

In the illustrated example, the first error injection circuit 402 can be bypassed via a first logic gate 420 and a second logic gate 422. The first and second logic gates 420, 422 of this example are inverter logic gates. An output (identified by Q) of the D-flip-flop 410 is coupled to an input of a first logic gate 420. An output of the first logic gate 420 is coupled to an input of a second logic gate 422. An output of the second logic gate 422 is coupled to a second input (identified by B) of the first multiplexer 418.

In some embodiments, the phase controller 130, and/or, more generally, the digital logic 122 of FIG. 1, can generate a first multiplexer selection signal 424 (identified by MUX-SEL<1>) to select the first input such as to output the first delayed clock signal 416 as an output of the first multiplexer 418. In some embodiments, the first multiplexer selection signal 424 can be generated in response to one of the first PRBS signals 134.

In some embodiments, the phase controller 130, and/or, more generally, the digital logic 122, can generate the first multiplexer selection signal 424 such as to pass the input clock signal 406 to a third logic gate 426 without delay from the first error injection circuit 402 and thereby bypass the first error injection circuit 402. In some embodiments, the first multiplexer selection signal 424 can be generated in response to a different one of the first PRBS signals 134.

The third logic gate 426 is an inverter logic gate and has an output coupled to a fourth logic gate 428 and a fifth logic gate 430 via a node 432. The third logic gate 426 and the fourth logic gate 428 of this example are inverter logic gates. The fifth logic gate 430 is a NAND logic gate. A first input (identified by A) of the fifth logic gate 430 is coupled to a sixth logic gate 434, which is an inverter logic gate. A second input (identified by B) of the fifth logic gate 430 is coupled to an output of the third logic gate 426.

An output of the fifth logic gate 430 is coupled to the second error injection circuit 404, which has an output coupled to a first input (identified by A) of a second multiplexer 436. An output of the fourth logic gate 428 is coupled to a second input (identified by B) of the second multiplexer 436. An output of a sixth logic gate 438, which is an inverter logic gate, is coupled to a third input (identified by C) of the second multiplexer 436. A fourth input (identified by D) of the second multiplexer 436 is configured to receive a signal 439 (identified by LVR_PD). In some embodiments, the signal 439 is a low-voltage release (LVR) signal from the PD 106 of FIG. 1. Alternatively, the second multiplexer 436 may not have the fourth input or may be configured to receive a different signal. An output of the second multiplexer 436 is coupled to a seventh logic gate 440, which has an output coupled to an input of a buffer 442. The seventh logic gate 440 of this example is an inverter logic gate.

In some embodiments, the second error injection circuit 404 is implemented by a DCDL 444. For example, the DCDL can include a plurality of buffers that can be individually configured to be in a delay chain or isolated from the delay chain. In some such embodiments, the DCDL can enable one or more buffers to be part of the delay chain and/or disable one or more buffers from being part of the delay chain.

In some embodiments, the first multiplexer 418 can output the input clock signal 406 (e.g., output without delay E0) or the first delayed clock signal 416 to the third logic gate 426. The third logic gate 426 can invert the output to generate a first clock signal 446 (identified by CLK1). The third logic gate 426 can provide the first clock signal 446 to the fifth logic gate 430 and input B via the fourth logic gate 428.

In some embodiments, the second multiplexer 436 can output the input clock signal 406 without delay or the input clock signal 406 delayed by at least one of the first error injection circuit 402 or the second error injection circuit 404. For example, in response to a first value of a second multiplexer selection signal 448 (identified by SMUX-SEL<3:0>), the second multiplexer 436 can output a signal received by input A, such as a second delayed clock signal 450 (identified by DCLK1). In some embodiments, the second delayed clock signal 450 can correspond to the input clock signal 406 delayed by the first error injection circuit 402 and/or the second error injection circuit 404. In some embodiments, in response to a second value of the second multiplexer selection signal 448, the second multiplexer 436 can output a signal received by input B, such as an inversion of the first clock signal 446. In some embodiments, the first clock signal 446 can correspond to the input clock signal 406 without delay or the input clock signal 406 delayed by the first error injection circuit 402 (and thereby bypassing the second error injection circuit 404). In some embodiments, in response to a third value of the second multiplexer selection signal 448, the second multiplexer 436 can output a signal received by input C, such as an inversion of a bypass signal 452. In some embodiments, the bypass signal 452 can be generated after a determination, such as by the phase controller 130, that the input clock signal 406 is to be passed through the circuit without delay. For example, the bypass signal 452 can be selected for output by the second multiplexer 436 to bypass the first error injection circuit 402 and the second error injection circuit 404.

In some embodiments, the fifth logic gate 430 can receive the first clock signal 446 via the third logic gate 426. The first clock signal 446 can be either the first delayed clock signal 416, which is the input clock signal 406 delayed by E0, or the input clock signal 406 without delay. If the first clock signal 446 is a logic high signal and the output of the sixth logic gate 434 is a logic low signal (e.g., signal SEL<1> is a logic high signal and inverted by the sixth logic gate 434), the fifth logic gate 430 can enable the DCDL 444 to delay an input of the DCDL 444 by a time delay. In some embodiments, the time delay is adjustable in response to an error control signal 454 (identified by E1CTRL<N:0>). The error control signal 454 can be a digital code in a range of 0 to N. In some embodiments, the error control signal 454 can instruct the DCDL 444 to implement a first time delay of E1a or a second time delay of E1b. For example, the second error injection circuit 404 can delay the first clock signal 446 by E1a or E1b (or any other number of values, e.g., E1c, E1d, etc.) to generate the second delayed clock signal 450. In some embodiments, in response to the first value of the second multiplexer selection signal 448, the second multiplexer 436 can output the second delayed clock signal 450 as the output clock signal 408. In some embodiments, the error control signal 454 can alternate such that during one clock cycle E1a can be used and during a subsequent clock cycle E1b can be used before returning to using E1a. Alternatively, the error control signal 454 may be generated such that E1a and E1b are chosen in any type of order.

In some embodiments, one or more of the signals depicted in the example of FIG. 4 can be generated by the phase controller 130, and/or, more generally, the control circuitry 126, and/or, more generally, the digital logic 122 of FIG. 1. For example, the phase controller 130 can generate at least one of the reference clock signal 412, value(s) of the first multiplexer selection signal 424, value(s) of the second multiplexer selection signal 448, the bypass signal 452, value(s) of the error control signal 454, or a selection signal 456 (identified by SEL<1>).

Figure 5:
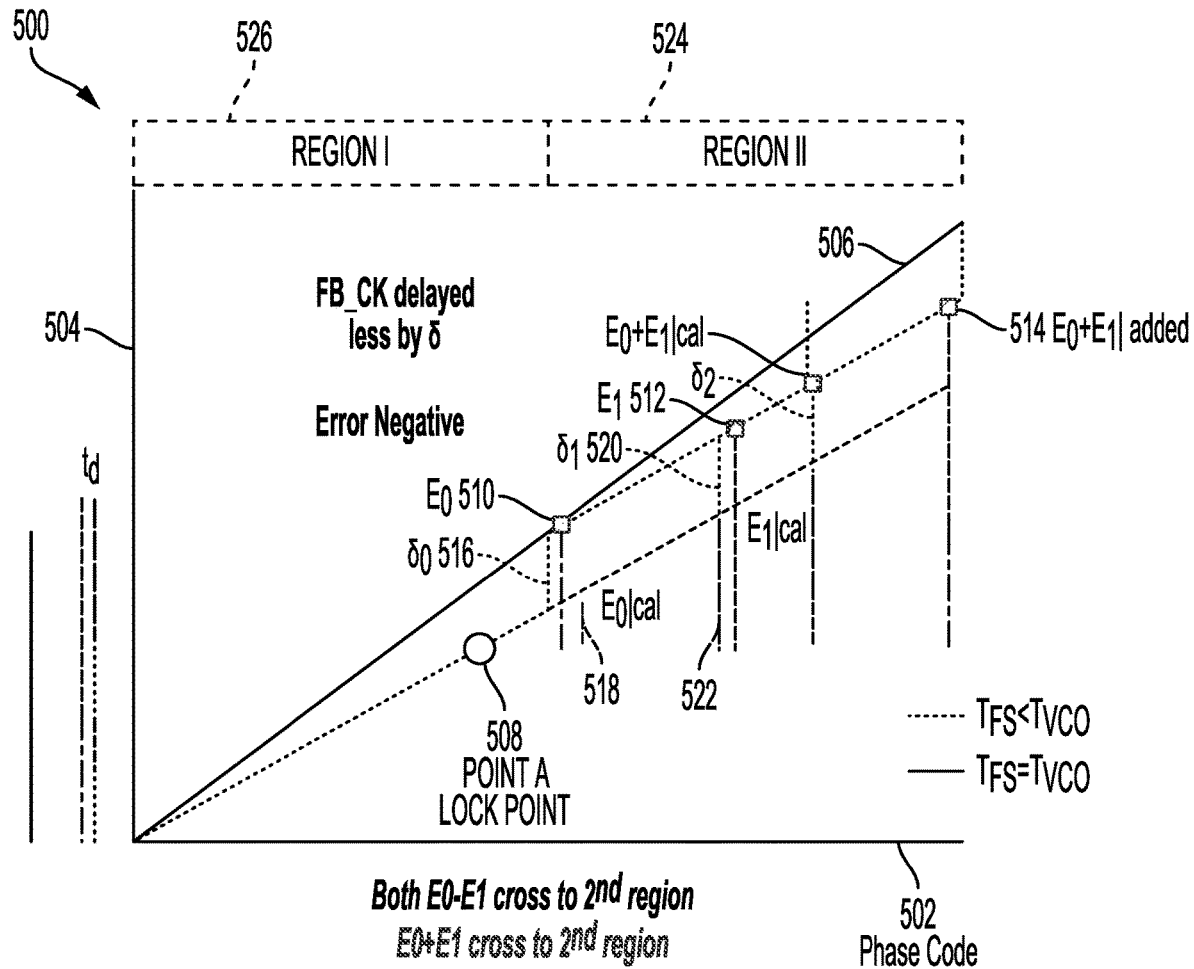
FIG. 5 is a plot of an example calibration operation of the digitally controlled delay line of FIG. 1.

FIG. 5 is a plot 500 of an example calibration operation of the digitally controlled delay line of FIG. 1 in response to a detection of negative error. The plot 500 has an x-axis 502 representing a range of phase codes, which can be digital codes that correspond to a desired and/or expected phase of a PLL, such as the PLL 100 of FIG. 1. The plot 500 has a y-axis 504 representing a range of time delays (identified by $t_d$). The plot 500 of the illustrated example can represent a gain of a DCDL, such as the DCDL 116 of FIG. 1. For example, the plot 500 can represent a time delay that may be needed to achieve a desired and/or expected phase of the PLL 100 in accordance with an ideal transfer function 506 for the DCDL.

The ideal transfer function 506 of this example is characterized and/or defined by a gain of 1. Alternatively, the ideal transfer function 506 may be characterized and/or defined by any other gain. In this example, the plot 500 depicts various lock points of the PLL 100. For example, a first lock point 508 (identified by Point A Lock Point) is depicted and can correspond to a time delay to be applied to the reference clock signal 102 of FIG. 1 such that the PLL 100 can lock without additional delay.

A second lock point 510 is depicted and can correspond to a time delay injected into the PLL 100 by an error injection circuit, such as the first error injection circuit 118 of FIG. 1. For example, the first error injection circuit 118 of FIG. 1, the first error injection circuit 302 of FIG. 3, and/or the first error injection circuit 402 of FIG. 4 can inject a time delay corresponding to E0 of the plot 500. In some embodiments, E0 can be a first error representing a first time delay that can be implemented by the first error injection circuit 118 of FIG. 1, the first error injection circuit 302 of FIG. 3, and/or the first error injection circuit 402 of FIG. 4.

A third lock point 512 is depicted and can correspond to a time delay injected into the PLL 100 by another error injection circuit, such as the second error injection circuit 120 of FIG. 1, the second error injection circuit 304 of FIG. 3, and/or the second error injection circuit 404 of FIG. 4. For example, the second error injection circuit 120 of FIG. 1, the second error injection circuit 304 of FIG. 3, and/or the second error injection circuit 404 of FIG. 4 can inject a time delay corresponding to E1 of the plot 200. In some embodiments, E1 can be a second error representing a second time delay that can be implemented by the second error injection circuit 120 of FIG. 1, the second error injection circuit 304 of FIG. 3, and/or the second error injection circuit 404 of FIG. 4.

A fourth lock point 514 is depicted and can correspond to a time delay injected into the PLL 100 by a combination of error injection circuits, such as a combination of the first and second error injection circuits 118, 120 of FIG. 1, the first and second error injection circuits 302, 304 of FIG. 3, and/or the first and second error injection circuits 402, 404 of FIG. 4. For example, the first and second error injection circuits 118, 120 of FIG. 1 can inject a time delay corresponding to a combination of E0 and E1 of the plot 500. In some embodiments, E0+E1 can be a third error representing a second time delay that can be implemented by a combination of error injection circuits.

In the illustrated example, the plot 500 depicts example calibration in response to the error injections. For example, the Frac-N controller 128 and/or the phase controller 130 can calibrate at least one of the MMD 114 or the DCDL 116 to reduce a gain error. For example, the digital logic 122 can calibrate the DCDL 116 to reduce a gain error of the DCDL 116 after injection(s) of E0, E1, or E0+E1 into the PLL 100.

By way of example, in response to an injection of E0 into the PLL 100, the digital logic 122 can detect a first error 516 (e.g., an error detected by the PD 106) (identified by $\delta_0$), which can represent a difference between an expected time delay of the ideal transfer function 506 at a phase code and an observed second time delay at the phase code. Beneficially, the digital logic 122 can calibrate the DCDL 116 to reduce the first error 516 and, thusly, reduce the gain error of the DCDL 116. In the example plot 500, the calibration can correspond to an amount of time delay 518 (identified by $E_0|cal$). The time delay amount 518 can be determined based on a difference between E0 (e.g., the time delay defined by and/or corresponding to E0) and the first error 516.

By way of another example, in response to an injection of E1 into the PLL 100, the digital logic 122 can detect a second error 520 (identified by $\delta_1$), which can represent a difference between an expected time delay of the ideal transfer function 506 at a phase code and an observed second time delay at the phase code. Beneficially, the digital logic 122 can calibrate the DCDL 116 to reduce the second error 520 and, thusly, reduce the gain error of the DCDL 116. In the example plot 500, the calibration can correspond to an amount of time delay 522 (identified by $E_1|cal$). The time delay amount 522 can be determined based on a difference between E1 (e.g., the time delay defined by and/or corresponding to E1) and the second error 520.

In the illustrated example, the time delays represented by E0, E1, and E1+E2 cross into a second region 524 (identified by REGION II) of the plot 500. Beneficially, the time delays have values such that the detected errors can be pushed from a first region 526 (identified by REGION I) into the second region 524 for improved error detection. For example, if E0, E1, and/or E1+E2 caused the error to be in the first region 526, the error may be indistinguishable from other error sources.

Figure 6:
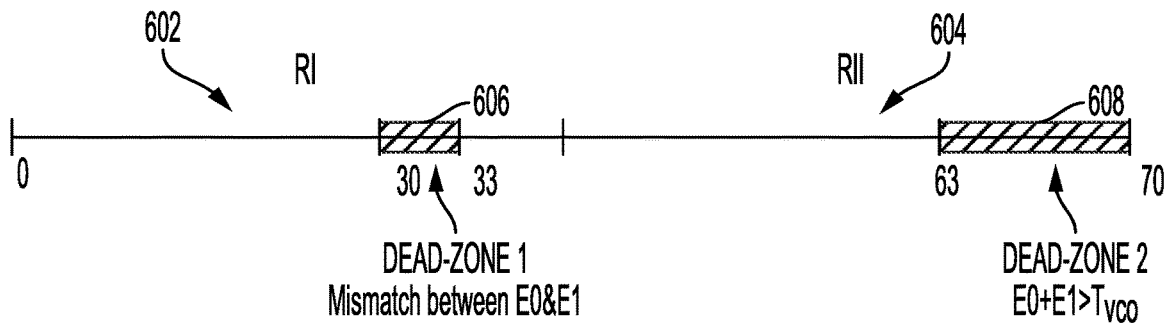
FIG. 6 depicts an example dead-zone analysis for determination of error values.

FIG. 6 depicts an example dead-zone analysis 600 for determination of error values. In the illustrated example, a period ($T_{VCO}$) of the VCO 112 of FIG. 1 is 70 picoseconds (ps) and half the period is 35 ps. In the illustrated example, a first time delay that can be injected and/or implemented by a first error injection circuit, such as the first error injection circuit 118 of FIG. 1, is E0 with a value of 37 ps. In the illustrated example, a second time delay that can be injected and/or implemented by a second error injection circuit, such as the second error injection circuit 120 of FIG. 1, is E1 with a value of 40 ps.

In FIG. 6, a first region 602 (identified by RI) is defined from 0 to half $T_{VCO}$, which is 35 ps. A second region 604 (identified by RII) is defined from half $T_{VCO}$ to $T_{VCO}$, which is 70 ps. For example, the first region 602 of FIG. 6 can correspond to the first region 526 of FIG. 5. In some embodiments, the second region 604 of FIG. 6 can correspond to the second region 524 of FIG. 5.

In some embodiments, a phase code that corresponds to a phase of the PLL 100 in a phase range of 0-30 ps and an error injection of E0 or E1 can result in a gain of the DCDL 116 of FIG. 1 to be in the first region 602. A phase code that corresponds to a phase of the PLL 100 in a phase range of 0-30 ps and an error injection of E0 and E1 (E0+E1) can result in a gain of the DCDL 116 of FIG. 1 to be in the second region 604. In some such embodiments, the detected error can be positive (+ve).

In some embodiments, a phase code that corresponds to a phase of the PLL 100 in a phase range of 30-33 ps and an error injection of E0 can result in a gain of the DCDL 116 of FIG. 1 to be in the first region 602. A phase code that corresponds to a phase of the PLL 100 in a phase range of 30-33 ps and an error injection of E1 can result in a gain of the DCDL 116 of FIG. 1 to be in the second region 604. In some such embodiments, the detected error is indeterminate because of the mismatch between E0 and E1. Thusly, the phase range of 30-33 ps, based on the example values of E0 and E1, may create a first error detection dead-zone 606 (identified by DEAD-ZONE 1) in this phase range. Similarly, a second error detection dead-zone 608 (identified by DEAD-ZONE 2) may exist in the phase range of 63-70 ps due to the combination of E0 and E1 being greater than $T_{VCO}$. In some embodiments disclosed herein, the values of E0 and E1 can be selected such that the error detection dead-zones 606, 608 may be avoided.

Figure 7:
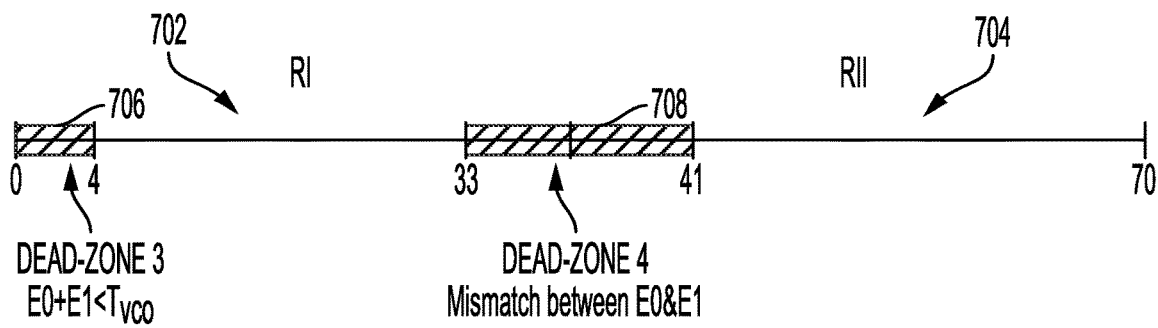
FIG. 7 depicts another example dead-zone analysis for determination of error values.

FIG. 7 depicts another example dead-zone analysis 700 for determination of error values. In the illustrated example, a period ($T_{VCO}$) of the VCO 112 of FIG. 1 is 70 ps and half the period is 35 ps. In the illustrated example, a first time delay that can be injected and/or implemented by a first error injection circuit, such as the first error injection circuit 118 of FIG. 1, is E0 with a value of 37 ps. In the illustrated example, a second time delay that can be injected and/or implemented by a second error injection circuit, such as the second error injection circuit 120 of FIG. 1, is E1 with a value of 29 ps.

In FIG. 7, a first region 702 (identified by RI) is defined from 0 to half $T_{VCO}$, which is 35 ps. A second region 704 (identified by RII) is defined from half $T_{VCO}$ to $T_{VCO}$, which is 70 ps. For example, the first region 702 of FIG. 7 can correspond to the first region 526 of FIG. 5. In some embodiments, the second region 704 of FIG. 7 can correspond to the second region 524 of FIG. 5.

In the illustrated example, a third error detection dead-zone 706 (identified by DEAD-ZONE 3) may exist in the phase range of 0-4 ps due to the combination of E0 and E1 being less than $T_{VCO}$. In the illustrated example, a fourth error detection dead-zone 708 (identified by DEAD-ZONE 4) may exist because of a mismatch between E0 and E1. For example, a phase code that corresponds to a phase of the PLL 100 in a phase range of 33-41 ps and an error injection of E0 can result in a gain of the DCDL 116 of FIG. 1 to be in the first region 702. A phase code that corresponds to a phase of the PLL 100 in the phase range of 33-41 ps and an error injection of E1 can result in a gain of the DCDL 116 of FIG. 1 to be in the second region 704. In some such embodiments, the detected error is indeterminate because of the mismatch between E0 and E1. Thusly, the phase range of 33-41 ps, based on the example values of E0 and E1, may create the fourth error detection dead-zone 708 in this phase range. In some embodiments disclosed herein, the values of E0 and E1 can be selected such that the error detection dead-zones 706, 708 may be avoided.

Figure 8:
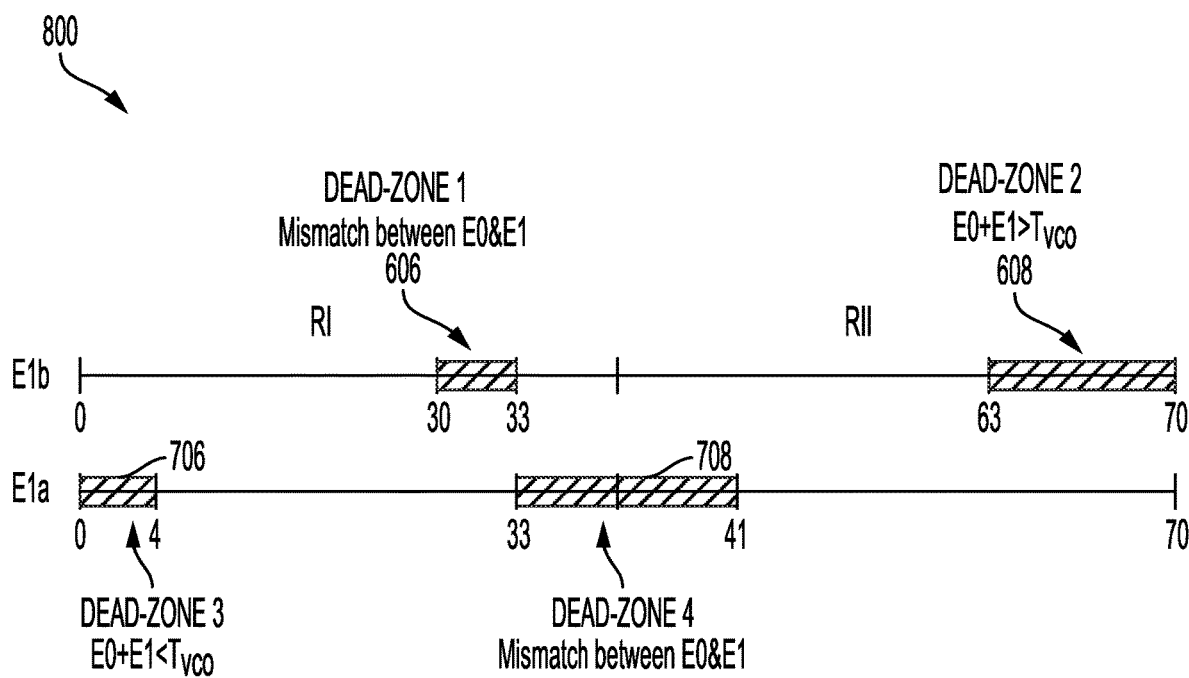
FIG. 8 depicts a combination of the example dead-zone analyses of FIGS. 6 and/or 7 for determination of error values.

FIG. 8 depicts a combination 800 of the example dead-zone analyses 600, 700 of FIGS. 6 and/or 7 for determination of error values. For example, there may be error detection dead-zones 606, 608, 706, 708 in the phase ranges of 0-4, 30-33, 33-41, and 63-70 ps. Beneficially, in some embodiments, error E1 can be adjustable such that it can have different error values to avoid the error detection dead-zones 606, 608, 706, 708. For example, selecting two values of E1 such that:

$$E1a < E0 < E1b;$$

$$E1a + E0 < T_{VCO}; \text{ and}$$

$$E1b + E0 > T_{VCO},$$

which can enable the avoidance of the error detection dead-zones 606, 608, 706, 708.

Exemplary conditions that may be satisfied to avoid the error detection dead-zones 606, 608, 706, 708 are as follows:

$$E1a = E0 - \delta_a = \frac{T_{VCO}}{2} + \varepsilon_0 - \delta_a,$$

Condition I, where E0 can be $$\frac{T_{VCO}}{2} + \varepsilon_0$$

(e.g., E0 is approximately half the period of the VCO 112);

$$E1b = E0 + \delta_b = \frac{T_{VCO}}{2} + \varepsilon_0 - \delta_b,$$

Condition II; and $$E1a + E0 < T_{VCO} \quad \text{Condition III.}$$

Condition III may be evaluated using Conditions I and II such that:

$$\frac{T_{VCO}}{2} + \varepsilon_0 - \delta_a + \frac{T_{VCO}}{2} + \varepsilon_0 < T_{VCO},$$

which yields $2\varepsilon_0 < \delta_a$.

An additional condition may be:

$$E1a + E0 < T_{VCO} \quad \text{Condition IV,}$$

which may be evaluated using Conditions I and II such that:

$$\frac{T_{VCO}}{2} + \varepsilon_0 - \delta_b + \frac{T_{VCO}}{2} + \varepsilon_0 > T_{VCO},$$

which yields $2\varepsilon_0 > -\delta_b$.

In the example conditions above, $\varepsilon_0$ can represent additional analog delay. For example, $\varepsilon_0$ can result from circuit manufacturing processes, thermal characteristics of circuit components, and/or the like. In the example conditions above, $\delta_a$ and $\delta_b$ can represent two different values or, in some embodiments, the same value, which can be used to determine E1a and E1b. For example, E1a and E1b can determined using the example conditions above and implemented in hardware by the DCDL 444 of FIG. 4, and/or, more generally, the second error injection circuit 404 of FIG. 4. For example, the DCDL 444 can be controlled such that it can delay an input signal by E1a or E1b. Beneficially, the values of E1a and E1b can be determined such that the error detection dead-zones 606, 608, 706, 708 of FIGS. 6, 7, and/or 8 can be avoided and, thusly, the gain error of the DCDL 116 of FIG. 1 can be calibrated regardless of the phase of the PLL 100.

Figure 9:
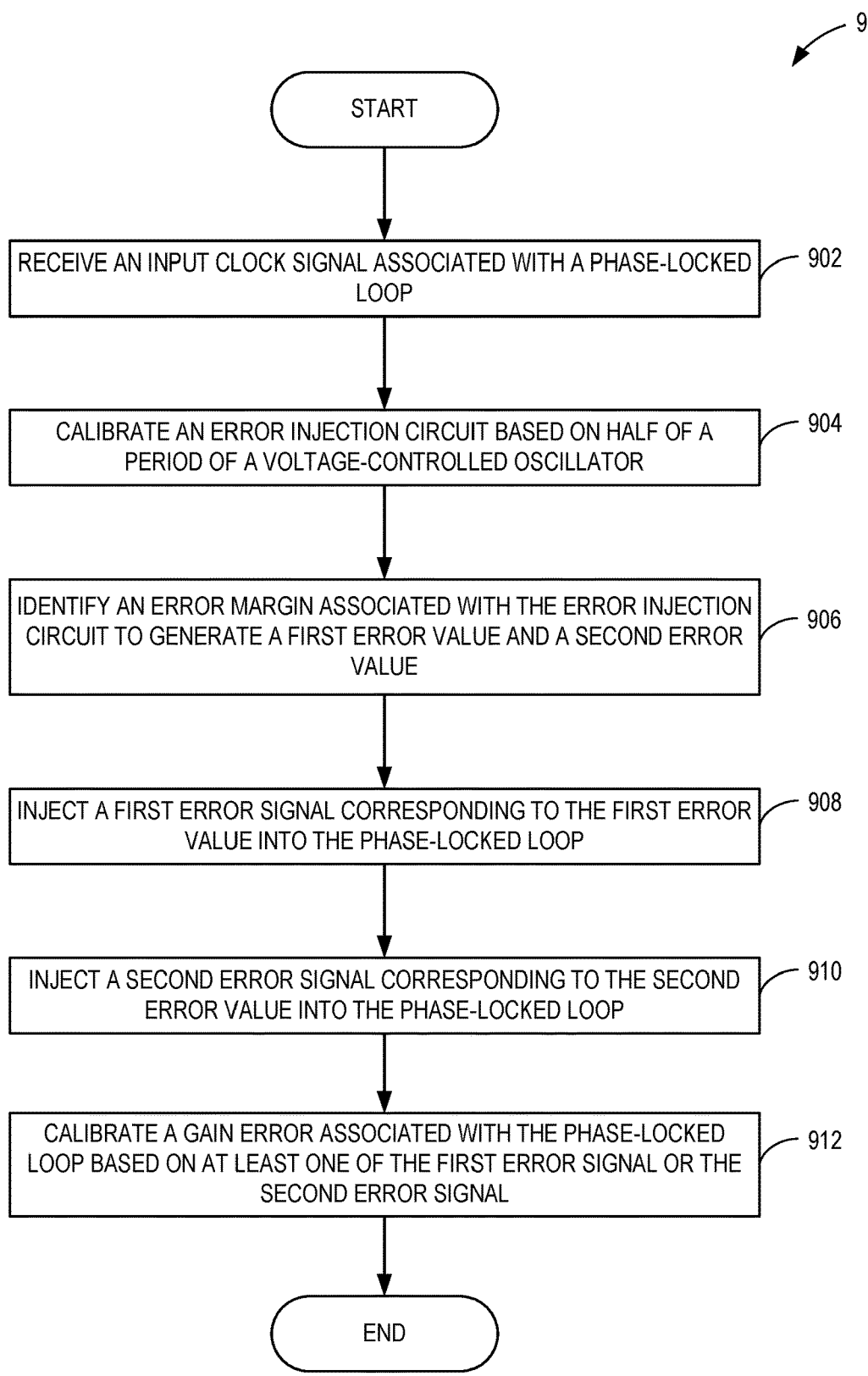
FIG. 9 is a flowchart representative of an example process that may be performed and/or implemented using hardware logic or machine-readable instructions that may be executed by processor circuitry to implement the phase-locked loop of FIG. 1.

FIG. 9 is a flowchart representative of an example process 900 that may be performed and/or implemented using hardware logic or machine-readable instructions that may be executed by processor circuitry to implement the phase-locked loop 100 of FIG. 1. The process 900 of FIG. 9 begins at block 902, at which the PLL 100 receives an input clock signal associated with a phase-locked loop. For example, the second error injection circuit 120 can receive the reference clock signal 102.

At block 904, the PLL 100 calibrates an error injection circuit based on half of a period of a voltage-controlled oscillator. For example, the digital logic 122 can calibrate the first error injection circuit 118 such that the first error injection circuit 118 can delay an output of the DCDL 116 by half of $T_{VCO}$.

At block 906, the PLL 100 identifies an error margin associated with the error injection circuit to generate a first error value and a second error value. For example, the digital logic 122 can determine at least one of $\delta_a$ or $\delta_b$ to satisfy the example conditions above for determination of a first error value, such as E1a, and a second error value, such as E1b.

At block 908, the PLL 100 injects a first error signal corresponding to the first error value into the phase-locked loop. For example, the phase controller 130, in response to one of the first PRBS signals 134 from the first PRBS generator 138, can instruct the first error injection circuit 118 to inject an error signal such that an output of the DCDL 116 is delayed by an error, such as E0.

At block 910, the PLL 100 injects a second error signal corresponding to the second error value into the phase-locked loop. For example, the phase controller 130, in response to one of the second PRBS signals 136 from the second PRBS generator 140, can instruct the second error injection circuit 120 to inject an error signal such that the reference clock signal 102 is delayed by an error, such as E1a or E1b.

At block 912, the PLL 100 calibrates a gain error associated with the phase-locked loop based on at least one of the first error signal or the second error signal. For example, the PD 106 can determine a phase difference between the outputs of the first and second error injection circuits 118, 120. In some embodiments, the digital logic 122 can calibrate the DCDL 116 based on the phase difference as described at least in connection with FIG. 5. Beneficially, the digital logic 122 can calibrate the DCDL 116 such that a gain error of the DCDL 116 is reduced. After calibrating the gain error at block 912, the process 900 of FIG. 9 concludes.

Techniques operating according to the principles described herein may be implemented in any suitable manner. The processing and decision blocks of the flowcharts above represent steps and acts that may be included in algorithms that carry out these various processes. Algorithms derived from these processes may be implemented as software integrated with and directing the operation of one or more single- or multi-purpose processors, may be implemented as functionally equivalent circuits such as a DSP circuit or an ASIC, or may be implemented in any other suitable manner. It should be appreciated that the flowcharts included herein do not depict the syntax or operation of any particular circuit or of any particular programming language or type of programming language. Rather, the flowcharts illustrate the functional information one skilled in the art may use to fabricate circuits or to implement computer software algorithms to perform the processing of a particular apparatus carrying out the types of techniques described herein. For example, the flowcharts, or portion(s) thereof, may be implemented by hardware alone (e.g., one or more analog or digital circuits, one or more hardware-implemented state machines, etc., and/or any combination(s) thereof) that is configured or structured to carry out the various processes of the flowcharts. In some examples, the flowcharts, or portion(s) thereof, may be implemented by machine-executable instructions (e.g., machine-readable instructions, computer-readable instructions, computer-executable instructions, etc.) that, when executed by one or more single- or multi-purpose processors, carry out the various processes of the flowcharts. It should also be appreciated that, unless otherwise indicated herein, the particular sequence of steps and/or acts described in each flowchart is merely illustrative of the algorithms that may be implemented and can be varied in implementations and embodiments of the principles described herein.

Accordingly, in some embodiments, the techniques described herein may be embodied in machine-executable instructions implemented as software, including as application software, system software, firmware, middleware, embedded code, or any other suitable type of computer code. Such machine-executable instructions may be generated, written, etc., using any of a number of suitable programming languages and/or programming or scripting tools, and also may be compiled as executable machine language code or intermediate code that is executed on a framework, virtual machine, or container.

When techniques described herein are embodied as machine-executable instructions, these machine-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc., that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement using the exemplary techniques described herein, and that embodiments are not limited to being implemented in any specific number, division, or type of functional facilities. In some implementations, all functionalities may be implemented in a single functional facility. It should also be appreciated that, in some implementations, some of the functional facilities described herein may be implemented together with or separately from others (e.g., as a single unit or separate units), or some of these functional facilities may not be implemented.

Machine-executable instructions implementing the techniques described herein (when implemented as one or more functional facilities or in any other manner) may, in some embodiments, be encoded on one or more computer-readable media, machine-readable media, etc., to provide functionality to the media. Computer-readable media include magnetic media such as a hard disk drive, optical media such as a CD or a DVD, a persistent or non-persistent solid-state memory (e.g., Flash memory, Magnetic RAM, etc.), or any other suitable storage media. Such a computer-readable medium may be implemented in any suitable manner. As used herein, the terms "computer-readable media" (also called "computer-readable storage media") and "machine-readable media" (also called "machine-readable storage media") refer to tangible storage media. Tangible storage media are non-transitory and have at least one physical, structural component. In a "computer-readable medium" and "machine-readable medium" as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium, a machine-readable medium, etc., may be altered during a recording process.

Further, some techniques described above comprise acts of storing information (e.g., data and/or instructions) in certain ways for use by these techniques. In some implementations of these techniques—such as implementations where the techniques are implemented as machine-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as machine-executable instructions, these instructions may be executed on one or more suitable computing device(s) and/or electronic device(s) operating in any suitable computer and/or electronic system, or one or more computing devices (or one or more processors of one or more computing devices) and/or one or more electronic devices (or one or more processors of one or more electronic devices) may be programmed to execute the machine-executable instructions. A computing device, electronic device, or processor (e.g., processor circuitry) may be programmed to execute instructions when the instructions are stored in a manner accessible to the computing device, electronic device, or processor, such as in a data store (e.g., an on-chip cache or instruction register, a computer-readable storage medium and/or a machine-readable storage medium accessible via a bus, a computer-readable storage medium and/or a machine-readable storage medium accessible via one or more networks and accessible by the device/processor, etc.). Functional facilities comprising these machine-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device (co-located or geographically distributed) dedicated to executing the techniques described herein, one or more FPGAs for carrying out the techniques described herein, or any other suitable system.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. An apparatus for calibrating a phase-locked loop, comprising:
   a digitally controlled delay line (DCDL) with a DCDL output and configured to:
      receive a clock signal to be output from a voltage-controlled oscillator; and
      delay the clock signal to generate a first delayed clock signal;
   an error injection circuit with a first error injection input and a second error injection input, the first error injection input coupled to the DCDL output; and
   a phase controller with a phase controller output coupled to the second error injection input, the phase controller configured to, in response to a pseudorandom binary sequence signal, instruct the error injection circuit to generate a second delayed clock signal based on a delay of the first delayed clock signal.

2. The apparatus of claim 1, wherein the error injection circuit has an error injection output, and further comprising a phase detector with a phase detector input coupled to the error injection output, and wherein the error injection circuit is configured to output the second delayed clock signal to the phase detector.

3. The apparatus of claim 2, wherein the second delayed clock signal is a second feedback clock signal, and the phase detector is configured to:
   determine a first phase difference between an input clock signal and a first feedback clock signal at a first time; and
   determine a second phase difference between the input clock signal and the second feedback clock signal at a second time, after the first time, and the second phase difference is less than the first phase difference.

4. The apparatus of claim 1, wherein the pseudorandom binary sequence signal is a first pseudorandom binary sequence signal, and the phase controller is configured to instruct the error injection circuit to pass the first delayed clock signal to a phase detector in response to a second pseudorandom binary sequence signal.

5. The apparatus of claim 1, wherein the error injection circuit is a first error injection circuit, and further comprising:
   a phase detector with a phase detector input; and
   a second error injection circuit with a third error injection input and an error injection output, the third error injection input configured to receive an input clock signal, and the error injection output coupled to the phase detector input.

6. The apparatus of claim 1, wherein the phase controller output is a first phase controller output, the phase controller has a second phase controller output, the error injection circuit is a first error injection circuit, the pseudorandom binary sequence signal is a first pseudorandom binary sequence signal, and further comprising:
- a second error injection circuit with a third error injection input coupled to the second phase controller output and configured to receive an input clock signal, and wherein
- the phase controller is configured to, in response to a second pseudorandom binary sequence signal, instruct the second error injection circuit to generate a delayed input clock signal based on a delay of the input clock signal.

7. The apparatus of claim 6, wherein the second error injection circuit has an error injection output, and further comprising a phase detector with a phase detector input coupled to the error injection output, and wherein the second error injection circuit is configured to output the delayed input clock signal to the phase detector.

8. The apparatus of claim 7, wherein the delayed input clock signal is a second delayed input clock signal, and the phase detector is configured to:
- determine a first phase difference between a first delayed input clock signal and a first feedback clock signal at a first time; and
- determine a second phase difference between the second delayed input clock signal and a second feedback clock signal at a second time, after the first time, and the second phase difference is less than the first phase difference.

9. The apparatus of claim 6, wherein the pseudorandom binary sequence signal is a first pseudorandom binary sequence signal, and the phase controller is configured to instruct the second error injection circuit to pass the input clock signal to a phase detector in response to a second pseudorandom binary sequence signal.

10. The apparatus of claim 6, wherein the error injection circuit is a first error injection circuit, the pseudorandom binary sequence signal is a first pseudorandom binary sequence signal, and further comprising:
- a first pseudorandom binary sequence generator configured to generate the first pseudorandom binary sequence signal; and
- a second pseudorandom binary sequence generator configured to generate a second pseudorandom binary sequence signal for control of the second error injection circuit.

11. The apparatus of claim 1, wherein the error injection circuit is a first error injection circuit, the phase controller output is a first phase controller output, and further comprising a second error injection circuit with a third error injection input, a fourth error injection input, and a second error injection output, the third error injection input is coupled to an output of the voltage-controlled oscillator, the fourth error injection input is coupled to second phase controller output of the phase controller, the second error injection output is coupled to a DCDL input of the DCDL, and the error injection circuit is configured to delay the clock signal from the voltage-controlled oscillator.

12. The apparatus of claim 1, wherein the error injection circuit is a first error injection circuit, the delay is a first delay, and further comprising a second error injection circuit configured to delay an input clock signal by a second delay.

13. The apparatus of claim 12, wherein the second error injection circuit is configured to delay the input clock signal by the second delay or a third delay, the second delay less than the first delay, and the third delay greater than the first delay.

14. The apparatus of claim 12, wherein the second error injection circuit is configured to delay the input clock signal by the second delay or a third delay, and a combination of the first delay and the second delay is less than a period of the voltage-controlled oscillator.

15. The apparatus of claim 12, wherein the second error injection circuit is configured to delay the input clock signal by the second delay or a third delay, and a combination of the first delay and the third delay is greater than a period of the voltage-controlled oscillator.

16. An apparatus for calibrating a phase-locked loop, comprising:
- a phase detector with a first phase detector input and a second phase detector input and configured to determine a phase difference between a first clock signal associated with an input path and a second clock signal associated with a feedback path;
- a first error injection circuit with a first error input and a first error output, the first error input configured to receive an input clock signal, the first error output coupled to the first phase detector input, and the first error injection circuit is configured to delay the input clock signal by a first delay to generate the first clock signal; and
- a second error injection circuit with a second error input and a second error output, the second error input configured to receive a feedback clock signal, the second error output coupled to the second phase detector input, and the second error injection circuit is configured to delay the feedback clock signal by a second delay to generate the second clock signal.

17. The apparatus of claim 16, further comprising digital logic to:
- control the first error injection circuit to provide the first delay based on a first output from a first pseudorandom binary sequence generator; and
- control the second error injection circuit to provide the second delay based on a second output from a second pseudorandom binary sequence generator.

18. The apparatus of claim 16, further comprising a first multiplexer and a second multiplexer, and wherein:
- the first error injection circuit comprises:
  - a first logic gate configured to receive the first clock signal and generate a first output; and
  - a second logic gate configured to invert the first output to generate a first inverted output and output the first inverted output to the first multiplexer;
- the second error injection circuit comprises:
  - a third logic gate configured to invert the first inverted output to generate a second inverted output; and
  - a fourth logic gate configured to invert the second inverted output to generate a third inverted output and output the third inverted output to the second multiplexer;
- the first multiplexer is configured to pass the first clock signal or the first inverted output as a first multiplexer output; and
- the second multiplexer is configured to pass the first multiplexer output or the third inverted output as a second multiplexer output.

19. An apparatus for calibrating a phase-locked loop, comprising:
- a digitally controlled delay line (DCDL) with a DCDL output and configured to:

receive a clock signal, the clock signal to be output from a voltage-controlled oscillator; and delay the clock signal to generate a first delayed clock signal;

an error injection circuit with a first error injection input and a second error injection input, the first error injection input coupled to the DCDL output; and a phase controller with a phase controller output coupled to the second error injection input, the phase controller configured to, in response to a pseudorandom binary sequence signal, instruct the error injection circuit to generate a second delayed signal based on a delay of the first delayed clock signal.

20. A method comprising:

receiving an input clock signal associated with a phase-locked loop;

calibrating a first error signal based on half a period of a voltage-controlled oscillator;

identifying an error margin associated with the first error signal to generate a first error value and a second error value;

injecting a second error signal corresponding to the first error value in the phase-locked loop;

injecting a third error signal corresponding to the second error value in the phase-locked loop; and calibrating a delay of the input clock signal based on at least one of the second error signal or the third error signal.

* * * * *